(12) United States Patent
Shackleton et al.

(10) Patent No.: US 12,195,382 B2
(45) Date of Patent: Jan. 14, 2025

(54) SUPERSTRATE AND A METHOD OF USING THE SAME

(71) Applicant: CANON KABUSHIKI KAISHA, Tokyo (JP)

(72) Inventors: Steven C. Shackleton, Austin, TX (US); Niyaz Khusnatdinov, Round Rock, TX (US)

(73) Assignee: CANON KABUSHIKI KAISHA, Tokyo (JP)

(*) Notice: Subject to any disclaimer, the term of this patent is extended or adjusted under 35 U.S.C. 154(b) by 460 days.

(21) Appl. No.: 17/457,146

(22) Filed: Dec. 1, 2021

(65) Prior Publication Data

US 2023/0167017 A1 Jun. 1, 2023

(51) Int. Cl.
| | | |
|---|---|---|
| *B32B 15/04* | (2006.01) | |
| *B32B 17/06* | (2006.01) | |
| *C03C 15/02* | (2006.01) | |
| *C03C 17/06* | (2006.01) | |
| *C03C 17/23* | (2006.01) | |
| *G03F 7/00* | (2006.01) | |
| *G03F 7/09* | (2006.01) | |

(52) U.S. Cl.
CPC .............. *C03C 17/06* (2013.01); *C03C 15/02* (2013.01); *C03C 17/23* (2013.01); *G03F 7/0002* (2013.01); *G03F 7/094* (2013.01); *C03C 2217/73* (2013.01); *C03C 2217/74* (2013.01); *C03C 2218/355* (2013.01)

(58) Field of Classification Search
CPC ......................................................... G03F 7/002
USPC .................................................. 428/426, 432
See application file for complete search history.

(56) References Cited

U.S. PATENT DOCUMENTS

| | | |
|---|---|---|
| 2,632,270 A | 3/1953 | Moss |
| 2,738,700 A | 3/1956 | Taylor |
| 4,106,856 A | 8/1978 | Babish |
| 4,910,380 A | 3/1990 | Reiss et al. |
| 5,736,424 A | 4/1998 | Prybyla et al. |
| 6,309,755 B1 | 10/2001 | Matsco et al. |
| 6,797,607 B2 | 9/2004 | Endisch et al. |

(Continued)

FOREIGN PATENT DOCUMENTS

| | | |
|---|---|---|
| GB | 770643 A | 3/1957 |
| JP | S5913900 U | 1/1984 |

(Continued)

OTHER PUBLICATIONS

Bailey et al., "Step and Flash Imprint Lithography: Template Surface Treatment and Defect Analysis", Journal of Vacuum Science & Technology B 18 (6), Nov./Dec. 2000, Microelectronics and Nanometer Structures, pp. 3572-3577.

(Continued)

*Primary Examiner* — Lauren R Colgan
(74) *Attorney, Agent, or Firm* — Abel Schillinger, LLP

(57) ABSTRACT

A superstrate for forming a planarization layer on a substrate can include a body having a first surface, a second surface opposite the first surface, and a chamfered edge between the first surface and the second surface. An opaque layer can coat the chamfered edge. In another embodiment, an opaque layer can coat the chamfered edge and a portion of the second surface. The superstrate can be used for more planarization or other processing sequences without causing extrusion defects.

20 Claims, 8 Drawing Sheets

(56) References Cited

U.S. PATENT DOCUMENTS

| | | | |
|---|---|---|---|
| 6,873,087 | B1 | 3/2005 | Choi et al. |
| 7,241,395 | B2 | 6/2007 | Sreenivasan et al. |
| 8,011,916 | B2* | 9/2011 | Suehira ............... B82Y 40/00 264/293 |
| 8,038,431 | B2* | 10/2011 | Sano ................... B29C 59/02 264/293 |
| 8,194,000 | B2 | 6/2012 | Lee et al. |
| 8,394,282 | B2 | 3/2013 | Panga et al. |
| 8,541,053 | B2 | 9/2013 | Menezes et al. |
| 8,961,800 | B2 | 2/2015 | Sreenivasan et al. |
| 9,063,409 | B2 | 6/2015 | Khusnatdinov et al. |
| 9,415,418 | B2 | 8/2016 | Sreenivasan et al. |
| 10,606,171 | B2 | 3/2020 | LaBrake et al. |
| 10,892,167 | B2* | 1/2021 | De Young ......... H01L 21/67017 |
| 10,935,883 | B2* | 3/2021 | Tavakkoli Kermani Ghariehali ............ G03F 7/0002 |
| 11,281,095 | B2* | 3/2022 | Tavakkoli Kermani Ghariehali ......... B29C 35/0805 |
| 11,562,924 | B2* | 1/2023 | Bamesberger ...... H01L 21/7684 |
| 11,776,840 | B2* | 10/2023 | Roy ................. H01L 21/68785 264/496 |
| 2006/0266916 | A1* | 11/2006 | Miller ................... B82Y 40/00 249/134 |
| 2009/0084136 | A1 | 4/2009 | Zhang et al. |
| 2010/0078846 | A1 | 4/2010 | Resnick et al. |
| 2010/0104852 | A1 | 4/2010 | Fletcher et al. |
| 2010/0109195 | A1 | 5/2010 | Xu et al. |
| 2010/0109201 | A1 | 5/2010 | Fletcher et al. |
| 2011/0192302 | A1 | 8/2011 | Selinidis |
| 2012/0073462 | A1 | 3/2012 | Imhof et al. |
| 2014/0160571 | A1* | 6/2014 | Miyazaki ................. G02B 7/02 359/614 |
| 2015/0221501 | A1* | 8/2015 | Tsuji ..................... G03F 7/0002 264/447 |
| 2017/0106399 | A1 | 4/2017 | Sreenivasan et al. |
| 2019/0086798 | A1* | 3/2019 | Nagai .................. B29C 59/002 |
| 2019/0101822 | A1* | 4/2019 | Tavakkoli Kermani Ghariehali ............ G03F 7/0002 |
| 2019/0227437 | A1 | 7/2019 | Resnick et al. |
| 2019/0377257 | A1* | 12/2019 | Fletcher .................. B29C 35/08 |
| 2020/0026183 | A1* | 1/2020 | Fletcher ................ B29C 59/022 |
| 2020/0183269 | A1* | 6/2020 | Tavakkoli Kermani Ghariehali ............ G03F 7/0022 |
| 2021/0041782 | A1* | 2/2021 | Higuchi ................ G03F 7/0002 |
| 2021/0096461 | A1* | 4/2021 | Kumada ................ H01L 21/027 |
| 2021/0125855 | A1* | 4/2021 | Roy .................... B29C 35/0805 |
| 2021/0173302 | A1* | 6/2021 | Suzaki .................. G03F 7/0002 |
| 2021/0181621 | A1* | 6/2021 | Fletcher ................ G03F 7/0002 |
| 2021/0181622 | A1* | 6/2021 | Lou ....................... H01L 21/681 |
| 2021/0187795 | A1* | 6/2021 | Tavakkoli Kermani Ghariehali ........ H01L 21/31138 |
| 2023/0095286 | A1* | 3/2023 | Tavakkoli Kermani Ghariehali ............ B05D 3/067 430/5 |

FOREIGN PATENT DOCUMENTS

| | | |
|---|---|---|
| JP | 2009149097 A | 7/2009 |
| JP | 2011529626 A | 12/2011 |
| JP | 2016528741 A | 9/2016 |

OTHER PUBLICATIONS

Chen et al., "Defect Control in Nanoimprint Lithography", Journal of Vacuum Science & Technology B 23 (6), Nov./Dec. 2005, Microelectronics and Nanometer Structures, pp. 2933-2938.

Chou, "Nanoimprint Lithography", Nanofabrication Handbook, Section 9.4.4.2, pp. 201-202, 2012, CRC Press, Boca Raton, FL, 2012.

\* cited by examiner

SUPERSTRATE AND A METHOD OF USING THE SAME

FIELD OF THE DISCLOSURE

The present disclosure relates to superstrates used in forming planarization layers over substrates.

RELATED ART

An inkjet adaptive planarization (IAP) process provides a surface having desired shape characteristics (for example planar). Generally, topography of a first surface is mapped to provide a density map. The density map is evaluated to provide a drop pattern for dispensing polymerizable material on the first surface. A plate (or superstrate) is brought into contact with the polymerizable material. The polymerizable material is solidified to have the desired shape characteristics. However, there can be a tendency to form extrusions, defined as the formable material which extends (or extrudes) beyond the edge of the superstrate. Such extruded material can accumulate on the edge of superstrate. During separation of the superstrate from the substrate following the curing of the formable material, the extruded, cured material can remain on the superstrate. The accumulated material can eventually break off and cause a defect when processing subsequent substrates.

As such, there is a need for a new superstrate to prevent extrusion defects.

SUMMARY

In an embodiment, a superstrate for forming a planarization layer on a substrate is disclosed. The superstrate can include, a body having a first surface, a second surface opposite the first surface, and a chamfered edge between the first surface and the second surface, where a layer coats the chamfered edge.

In another embodiment, the chamfered edge can include a first surface and one or more angled surfaces where the layer coats a first angled surface.

In yet another embodiment, the first angled surface can be between the first surface of the body and the first surface of the chamfered edge.

In a further embodiment, the layer can coat the first angled surface and a portion of the second surface of the body.

In yet a further embodiment, the layer can coat the entire chamfered edge and a portion of the second surface of the body.

In another embodiment, the portion of the second side of the body can have a length that is between 10% and 30% a total length of the second surface.

In yet another embodiment, the layer can include chrome, chromium, molybdenum, tantalum, silicon, tungsten, titanium, aluminum, iron oxide, titanium, or a silver-halide emulsion.

In still a further embodiment, the body can include soda lime glass, quartz, borosilicate glass, alkali-barium silicate glass, aluminosilicate glass, or synthetic fused silica.

In yet a further embodiment, the layer can have one or more of the following optical properties: a reflectance of visible light that is greater than 30%; and an absorbance of UV light that is greater than 70%.

In another embodiment, the layer can have the following optical properties: a reflectance of visible light that is greater than 30%; and an absorbance of UV light that is greater than 70%.

A method of manufacturing an article is disclosed. The method can include depositing a formable material on the substrate, contacting the formable material on the substrate with a superstrate to form a planar layer, wherein the superstrate can include: a body having a first surface; a second surface opposite the first surface; and a chamfered edge between the first surface and the second surface, where a layer coats the chamfered edge. The method can also include curing the formable material on the substrate to form the planarization layer, separating the superstrate from the planar layer on the substrate, processing the substrate on which the planar layer has been formed, and manufacturing the article from the processed substrate.

In a particular embodiment, the method of manufacturing the article can further include registering a location of the superstrate by detecting a reflection of visible light off of the coating, and handling the superstrate based on the registered location of the superstrate to load the superstrate onto a superstrate chuck used for holding the superstrate.

In another embodiment, the first surface of the body of the superstrate can contact the formable material on the substrate.

In a further embodiment, an area of the superstrate can be larger than an area of the substrate.

A method of manufacturing a superstrate is disclosed. The method can include, forming a body with a first surface, a second surface opposite the first surface, and a chamfered edge between the first surface and the second surface, coating the first surface and the chamfered edge with an opaque material, and removing the opaque material from the first surface.

In another embodiment, the chamfered edge can include a first surface and one or more angled surfaces, and wherein coating the chamfered edge with the opaque material comprises coating a first angled surface of the chamfered edge.

In a further embodiment, the first angled surface can be a mirror of the second angled surface.

In a particular embodiment, the first angled surface can have a length that is less than the second angled surface.

In another embodiment, the second angled surface is between the second surface of the body and the first angled surface of the chamfered edge.

In still another embodiment, removing the material from the first surface can be done by polishing the first surface.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the imprint and lithography arts.

A superstrate can include a body having a chamfered edge and a layer on the chamfered edge. The superstrate can be used for planarization or other processing sequences.

Details regarding the superstrate and methods of using the superstrate are better understood after reading this specification in conjunction with figures. The description below is meant to illustrate embodiments and not limit the scope of the present invention, which is defined in the appended claims.

Figure 1:
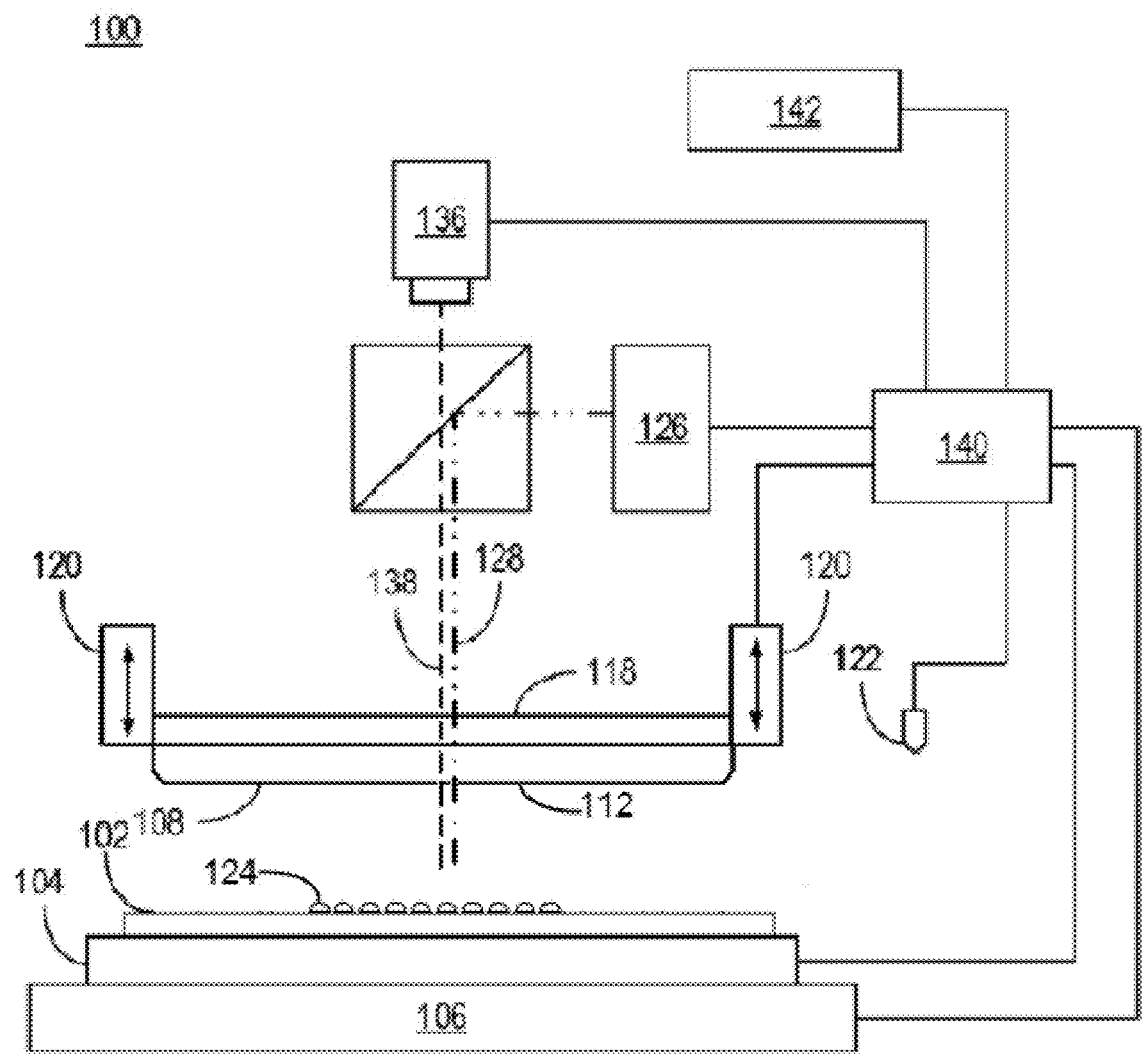
FIG. 1 includes an illustration of a side view of an exemplary apparatus.

Referring to FIG. 1, an apparatus 100 in accordance with an embodiment described herein can be used to aid in shaping a layer including a liquid precursor 124 over a substrate 102. The substrate 102 may be for example a semiconductor wafer or a blank nanoimprint lithography superstrate. The substrate 102 may be coupled to a substrate chuck 104. As illustrated, the substrate chuck 104 is a vacuum chuck; however, in other embodiments the substrate chuck 104 may be any chuck including vacuum, pin-type, groove-type, electrostatic, electromagnetic, or the like. Exemplary chucks are described in U.S. Pat. No. 6,873,087, which is hereby incorporated by reference.

The substrate 102 and substrate chuck 104 may be further supported by a substrate positioning stage 106. The stage 16 may provide translating or rotational motion along the X-, Y-, or Z-directions. The substrate positioning stage 106 may provide translational and/or rotational motion along one or more of the x-, y-, z-, θ-, ψ, and φ-axes. The substrate positioning stage 106, the substrate 102, and the substrate chuck 104 may also be positioned on a base (not shown). The substrate positioning stage may be a part of a positioning system.

Spaced-apart from the substrate 102 is a superstrate 108 to be used in performing an adaptive planarization on the substrate 102, having a working surface 112 facing substrate 102. More details regarding the superstrate 18 are described later in this specification. Superstrate 108 may be formed from materials including, but not limited to, fused silica, quartz, silicon, organic polymers, siloxane polymers, borosilicate glass, fluorocarbon polymers, metal, hardened sapphire, and/or the like. In an embodiment the superstrate 108 is readily transparent to actinic radiation for example UV light.

The superstrate 108 may be coupled to or retained by a superstrate chuck 118. The superstrate chuck 118 may be, but is not limited to, vacuum chuck, pin-type chuck, groove-type chuck, electrostatic chuck, electromagnetic chuck, and/or other similar chuck types. The superstrate chuck 118 may be configured to apply stress, pressure, and/or strain to superstrate 108 that varies across the superstrate 108. In an embodiment the superstrate chuck 118 is likewise readily transparent to UV light. The superstrate chuck 118 may include a system such as a zone based vacuum chuck, an actuator array, a pressure bladder, etc., which can apply a pressure differential to a back surface of the superstrate 108 to cause the superstrate 108 to bend and deform. In one embodiment, the superstrate chuck 118 includes a zone based vacuum chuck which can apply a pressure differential to a back surface of the superstrate, causing the superstrate to bend and deform.

The superstrate chuck 118 may be coupled to a head 120 which is a part of the positioning system. The head 120 may be movably coupled to a bridge. The head 120 may include one or more actuators such as voice coil motors, piezoelectric motors, linear motor, nut and screw motor, etc., which are configured to move the superstrate chuck 118 relative to the substrate 102 in at least the z-axis direction, and potentially other directions (e.g., x-, y-, θ-, ψ-, and φ-axis). Either the head 120, substrate positioning stage 106, or both can vary a distance between the superstrate 108 and the substrate 102 to define a desired volume there between that is filled by formable material 124.

The apparatus 100 may further comprise a fluid dispenser 122. The fluid dispenser 122 may also be movably coupled to the bridge. In an embodiment, the fluid dispenser 122 and the head 120 share one or more of all positioning components. In an alternative embodiment, the fluid dispenser 122 and the head 120 move independently from each other. The fluid dispenser 122 may be used to deposit droplets of liquid formable material 124 (e.g., a photocurable polymerizable material) onto the substrate 102 with the volume of deposited material varying over the substrate 102 based on at least in part upon the topography profile of the substrate. Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids. The dispenser 122 may dispense the formable material 124 onto the substrate prior to the superstrate 108 being brought into contact with the formable material 124.

The apparatus 100 may further comprise a curing system that includes a radiation source 126 that directs actinic energy, for example, UV radiation, along an exposure path 128. The head 120 and the substrate positioning stage 106 may be configured to position the superstrate 108 and the substrate 102 in superimposition with the exposure path 128. The radiation source 126 sends the actinic energy along the exposure path 128 after the superstrate 108 has contacted the formable material 128. FIG. 1 illustrates the exposure path 128 when the superstrate 108 is not in contact with the formable material 124. This is done for illustrative purposes so that the relative position of the individual components can be easily identified. An individual skilled in the art would understand that exposure path 128 would not substantially change when the superstrate 108 is brought into contact with the formable material 124.

The apparatus 100 may further comprise a camera 136 positioned to view the spread of formable material 124 as the superstrate 108 contacts the formable material 124 during the planarization process. FIG. 1 illustrates an optical axis 138 of the field camera's imaging field. As illustrated in FIG. 1, the apparatus 100 may include one or more optical components (dichroic mirrors, beam combiners, prisms, lenses, mirrors, etc.) which combine the actinic radiation with light to be detected by the camera 136. The camera 136 may include one or more of a CCD, a sensor array, a line camera, and a photodetector which are configured to gather light at a wavelength that shows a contrast between regions underneath the superstrate 108 and in contact with the formable material 124 and regions underneath the superstrate 108 but not in contact with the formable material 124. The camera 136 may be configured to provide images of the spread of formable material 124 underneath the superstrate 108, and/or the separation of the superstrate 108 from cured formable material 124. The camera 136 may also be configured to measure interference fringes, which change as the formable material 124 spreads between the gap between the working surface 112 and the substrate surface.

The apparatus 100 may be regulated, controlled, and/or directed by one or more processors 140 (controller) in communication with one or more components and/or subsystems such as the substrate chuck 104, the substrate positioning stage 106, the superstrate chuck 118, the head 120, the fluid dispenser 122, the radiation source 126, and/or the camera 136. The processor 140 may operate based on instructions in a computer readable program stored in a non-transitory computer memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

In operation, either the head 120, the substrate position stage 106, or both vary a distance between the superstrate 108 and the substrate 102 to define a desired space (a bounded physical extent in three dimensions) that is filled with the formable material 124. For example, the head 120 may be moved toward the substrate and apply a force to the superstrate 108 such that the superstrate 108 contacts and spreads droplets of the formable material 124 across the substrate 102.

Figure 2A:
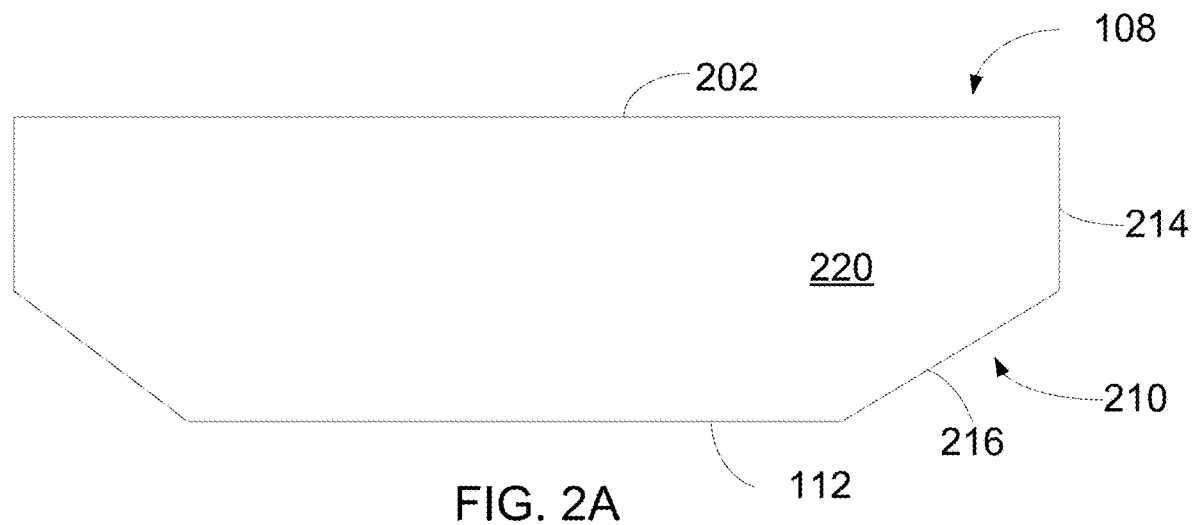
FIGS. 2A-2B include an illustration of a cross-sectional view and planar view of a superstrate in the apparatus of FIG. 1.
Figure 2B:
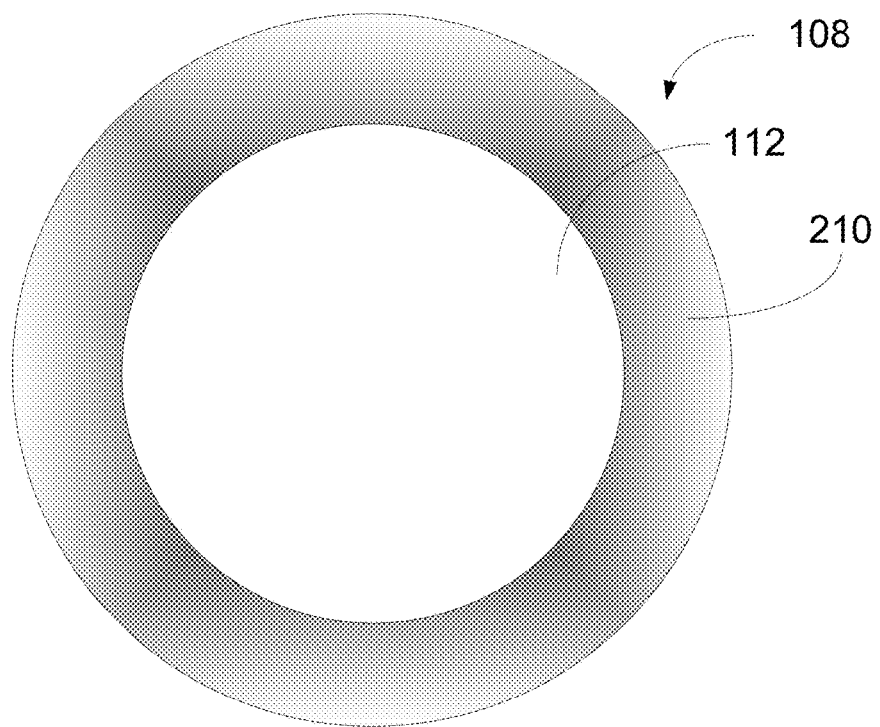

Details regarding the superstrate 108 are described with respect to FIGS. 2A and 2B. FIG. 2A is an illustration of a cross-sectional view of a portion of a superstrate 108 in the apparatus of FIG. 1, according to one embodiment. FIG. 2B is a bottom view of the superstrate 108, according to one embodiment. The superstrate 108 can include a body 220 having a first surface 112 and a second surface 202 parallel to the first surface 112. The first surface 112 can face the substrate 102 in operation. In one embodiment, the first surface 112 can be planar. The first surface 112 does not have recessions and protrusions and can be referred to as a blank. The first surface 112 can have an area that is at least 90% of the area of the substrate 102 and may have an area that is the same or larger than the substrate 102. In an embodiment, the surface area is at least 280 cm$^2$, at least 700 cm$^2$, at least 1100 cm$^2$, or larger, and in another embodiment, the surface area may be at most 31,500 cm$^2$. The first surface 112 can have a two-dimensional shape including a circle, an ellipse, a rectangle (including a square), a hexagon, or the like. The first surface 112 can have a surface roughness that can be determined using atomic force microscopy, optical profiler, a profilometer, etc. An edge exclusion of 3 mm may be used, as readings too close to the periphery can corrupt the surface roughness measurements. The surface roughness may be a median value of the readings. In an embodiment, a representative amount of the area that includes the center may be used for the readings. For example, for a 300 mm diameter substrate 102, readings for the first surface 112 may be taken at any location between the center and edge exclusion region; however, for a 450 mm diameter substrate 102, the readings for the superstrate 108 may be taken within the 150 mm of the center of the superstrate 108 if the superstrate 108 is only used for 300 mm wafers. In an embodiment, the surface roughness may be for a contact area of the surface 112, wherein the contact area is an area in which the superstrate 108 contacts the planarization precursor material 124 during a contacting operation. In an embodiment, the surface roughness of the surface 112 of the body 220 is at most 1 nm, at most 0.5 nm, or at most 0.2 nm, and in another embodiment, the threshold is at least 0.1 nm.

The body 220 has a transmittance of at least 70%, at least 80%, at least 85%, or at least 90% for radiation used to cure a planarization precursor material. The body 220 can include a glass-based material, silicon, an organic polymer, a siloxane polymer, a fluorocarbon polymer, a sapphire, a spinel, another similar material, or any combination thereof. The glass-based material can include soda lime glass, borosilicate glass, alkali-barium silicate glass, aluminosilicate glass, quartz, synthetic fused-silica, or the like. The body 220 can have a thickness in a range of 30 microns to 2000 microns.

Figure 3:
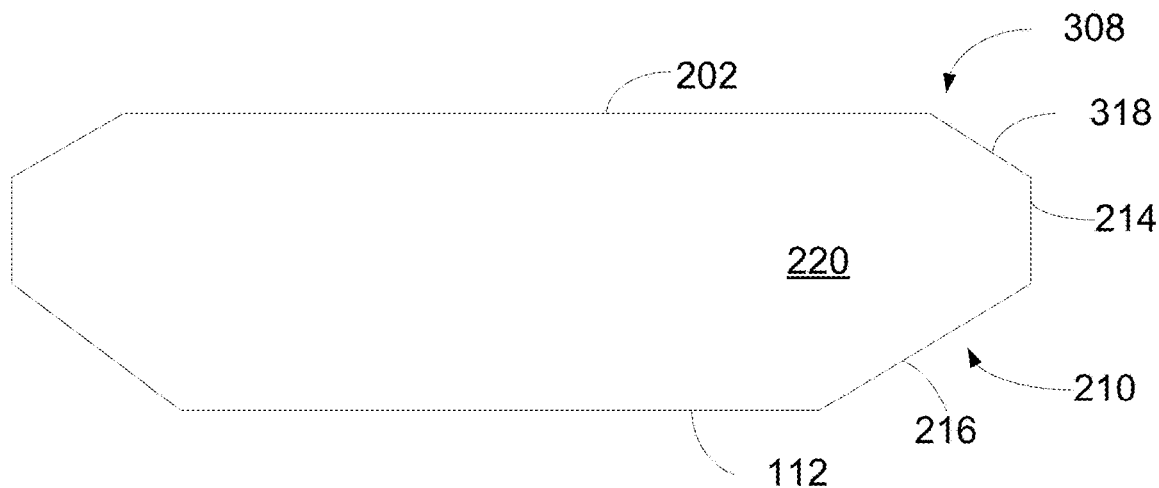
FIG. 3 includes an illustration of a cross-sectional view of a superstrate, according to one embodiment.

The body 220 can also include a chamfered edge 210. In one embodiment, as seen in FIG. 2A, the chamfered edge 210 can include a surface 214 perpendicular to the first surface 112, and an angled surface 216 connecting the surface 214 and the first surface 112. In one embodiment, the surface 214 can be orthogonal to the second surface 202 and connect the second surface 202 to the angles surface 216. In another embodiment, the chamfered edge 210 can include more than one angled surface, as seen in FIG. 3. In one embodiment, the chamfered edge 210 can include a first angled surface 216, a second angled surface 318, and a surface 214 between the first angled surface 216 and the second angled surface 318. In one embodiment, the first angled surface 216 can be a mirror of the second angled surface 214. In one embodiment, the chamfered edge 210 is a curved surface that connects the first surface 112 to the second surface 202. In one embodiment, the chamfered edge 210 included one or more curved and/or angled surfaces that connect the first surface 112 to the second surface 202.

However, when such superstrates 108 are used, in particular under high throughput conditions, there can be a tendency to form extrusions, defined as the formable material which extends (or extrudes) beyond the border of the first surface 112. Such extruded material can accumulate on the chamfered edges and subsequently solidify upon exposure to actinic radiation. During separation of the superstrate from the substrate following the curing of the formable material 124, the extruded, cured material can remain on the chamfered edges of the superstrate 108. The accumulated material can eventually break off and cause a defect on a subsequent substrate 102 and that negatively affects subsequent processing. Accordingly, the inventors have discovered a new design, described in detail below, to address extrusion defects.

Figure 4A:
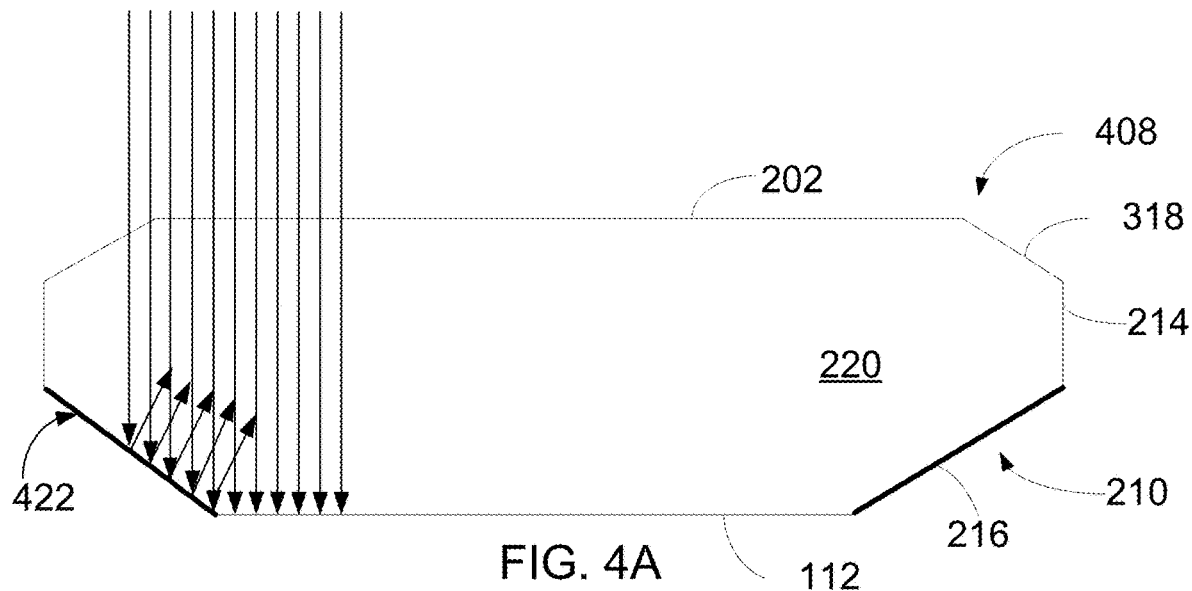
FIGS. 4A-4C include an illustration of a cross-sectional view of a superstrate, according to one embodiment.
Figure 4B:
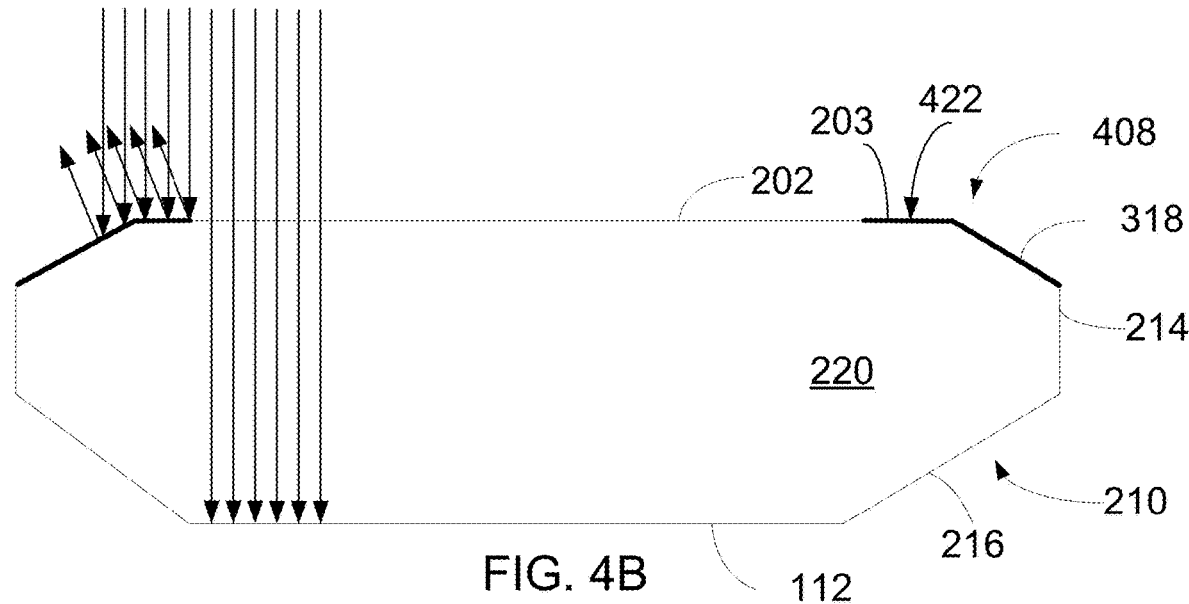
Figure 4C:
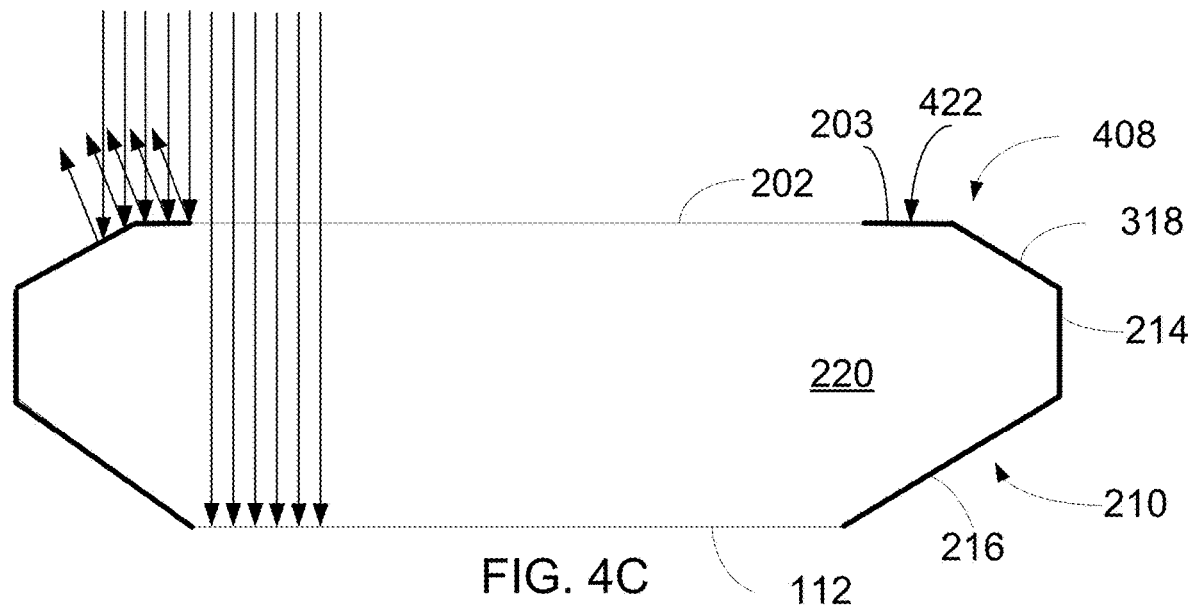

FIGS. 4A-4C are each a cross-sectional view of a portion of a superstrate with a chamfered edge, according to an embodiment. The body 220 can include a layer, as further described with respect to the embodiments of FIGS. 4A-4C. In an embodiment, the layer is semitransparent and blocks sufficient actinic radiation so as to prevent curing or gelling of the accumulated material and allow evaporation of the accumulated material on the chamfered edge. In one embodiment, the layer is an opaque layer. In one embodiment, the layer has a reflectance of visible light that is greater than 30% and less than or equal to 100%. In another embodiment, the layer has an absorbance of UV light that is greater than 70% and less than or equal to 100%. In another embodiment, the layer has both a reflectance of visible light that is greater than 30% and less than or equal to 100% and an absorbance of UV light that is greater than 70% and less than or equal to 100%. In another embodiment, the layer has a reflectance of visible light that is at least 30%, such as at least 35%, or at least 40%. In another embodiment, the layer has a reflectance of visible light that is no greater than 100%, such no greater than 750%, or no greater than 60%. In one embodiment, the layer has an absorbance of UV light that is at least 70%, such as at least 75%, or at least 80%. In another embodiment, the layer has an absorbance of UV light that is no greater than 100%, such as no greater than 95%, or no greater than 90%.

In another embodiment, the layer has a thickness between 5 nm and 200 nm. In one embodiment the thickness is at least 5 nm, such as at least 20 nm, or at least 100 nm. In one embodiment the thickness is no greater than 200 nm, such as no greater than 180 nm, or no greater than 150 nm. In one embodiment, the superstrate 408 can include a chamfered edge 210 with an opaque layer 422. In another embodiment, the superstrate 408 can include a chamfered edge 210 and a portion of the second side 202 with a layer. In one embodiment, the portion of the second side of the body has a length that is between 10% and 30% a total length of the second side.

The opaque layer 422 can include one or more of chrome, chromium, molybdenum, tantalum, silicon, tungsten, titanium, aluminum, iron oxide, titanium, or a silver-halide emulsion. In one embodiment, the chamfered edge 210 can include the opaque layer 422. In one embodiment, more than one surface of the chamfered edge 210 can include the opaque layer 422. In one embodiment, a first angled side 216 of the chamfered edge 210 can include the opaque layer 422, as seen in FIG. 4A. In another embodiment, the chamfered edge 210 and a portion of the second surface 202 can include the opaque layer 422. The second angled surface 318 of the chamfered edge 210 and a portion 203 of the second surface 202 can include the opaque layer 422, as seen in FIG. 4B. In yet another embodiment, the first angled surface 216, the second angled surface 318, the surface 214, and a portion 203 of the second surface 202 can include the opaque layer 422, as seen in FIG. 4C. As can be seen with the arrows in FIGS. 4A-4C, the opaque layer 422 can block visible and UV light from transferring through the superstrate during exposure or optical sensor detection. As such, any formable material that could get on the chamfered edge of the superstrate during planarization will not receive curable light and will therefore not harden or stick to the superstrate 108. Embodiments as described herein are useful in extending the life of superstrates.

Figure 5A:
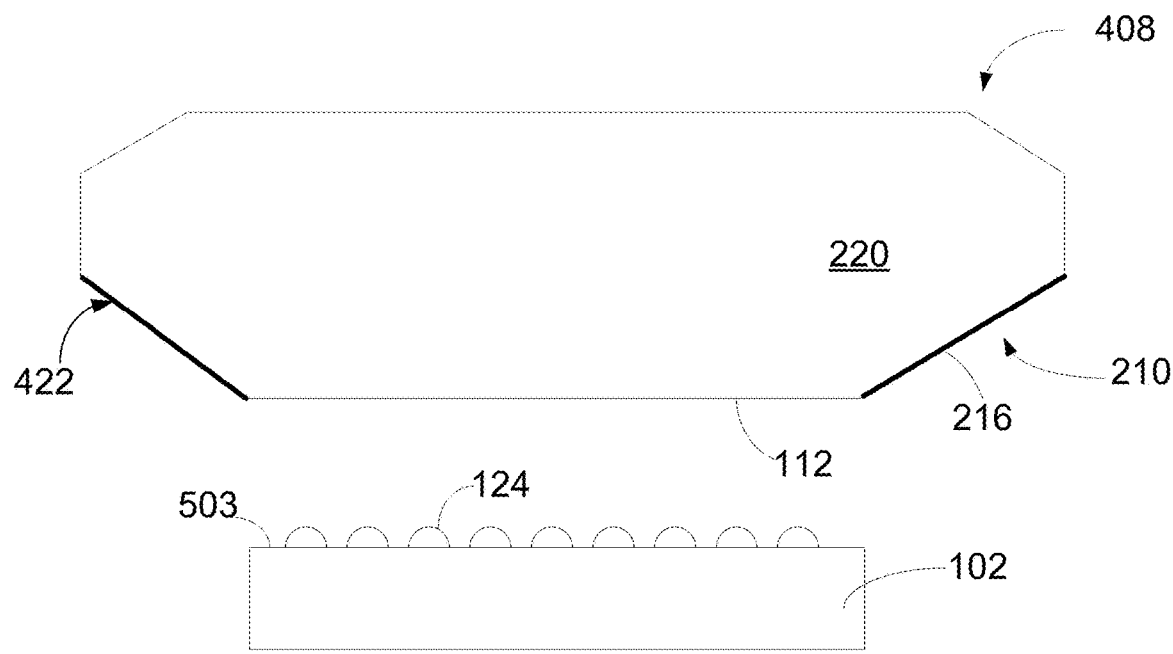
FIGS. 5A-5C include an illustration of a cross-sectional view a superstrate and a substrate during a planarization process, according to one embodiment.
Figure 5B:
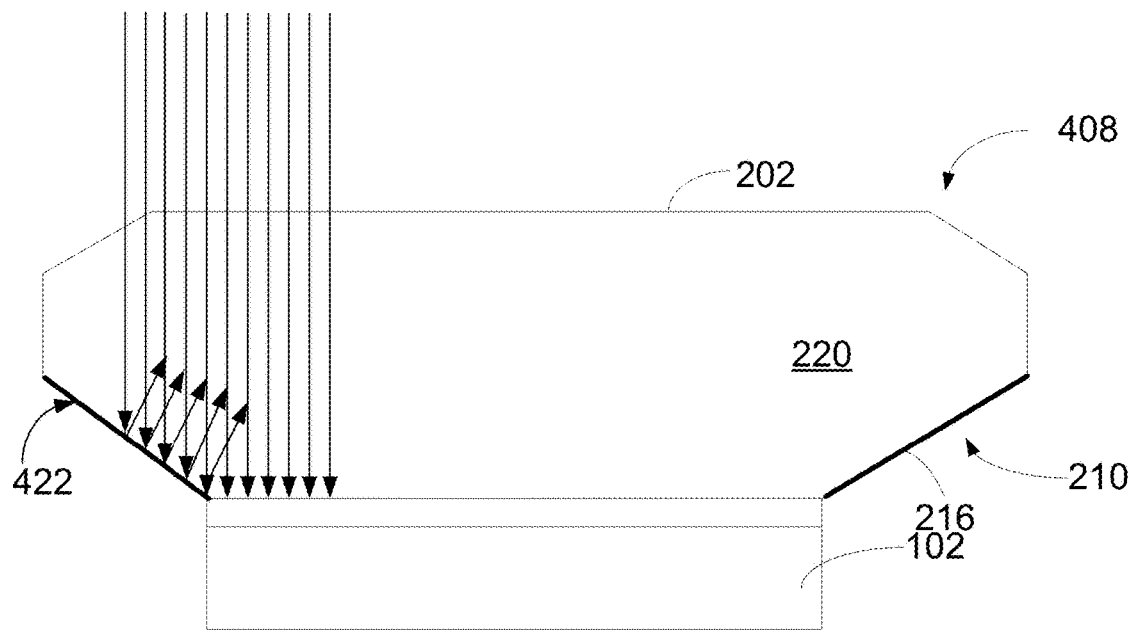
Figure 5C:
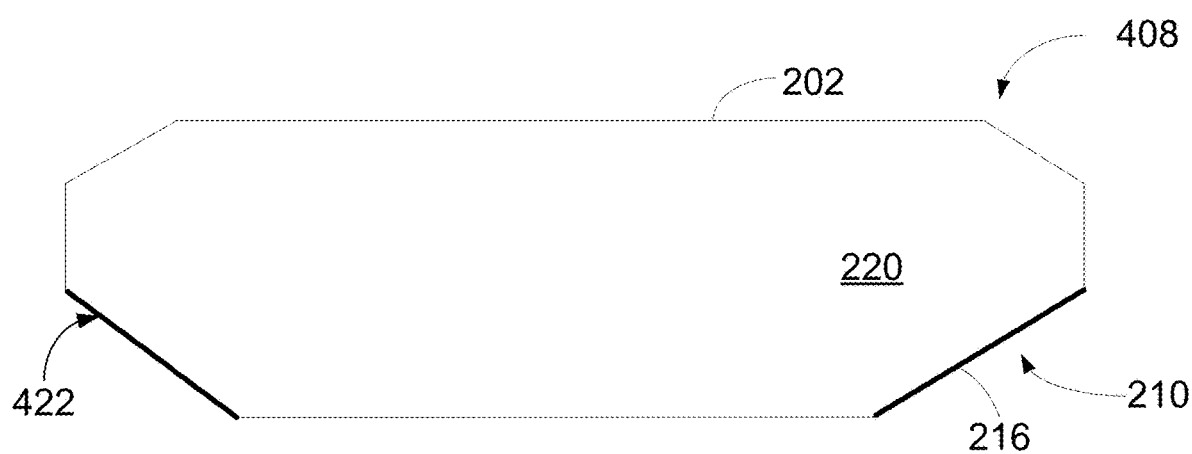
Figure 5C:
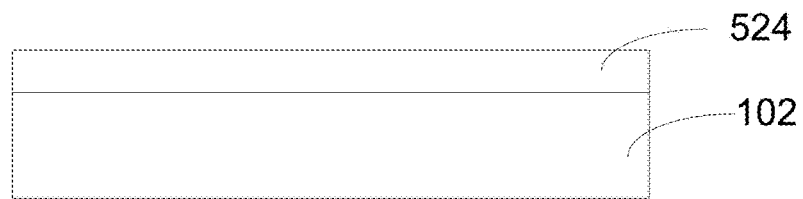
Figure 6:
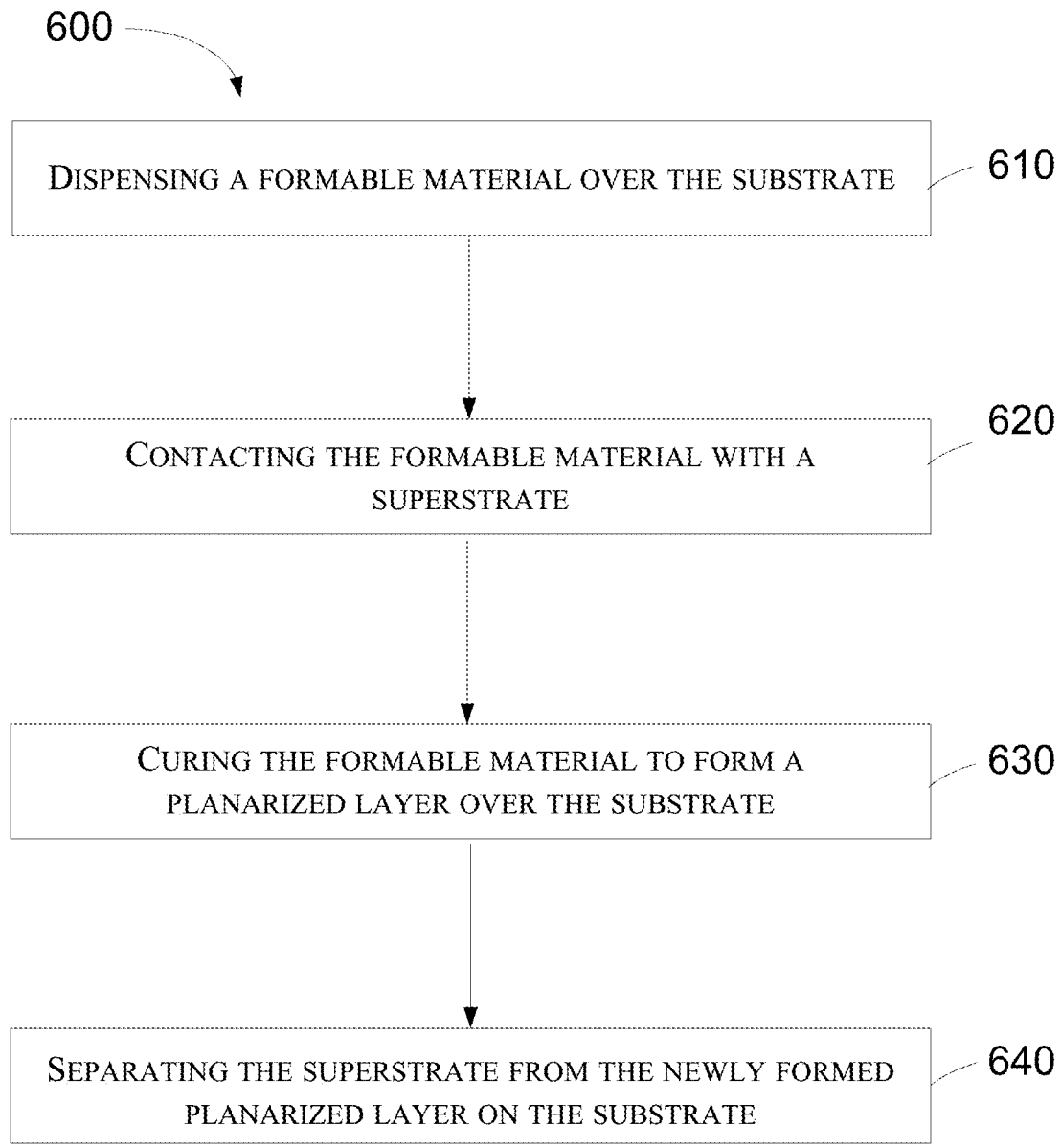
FIG. 6 includes an illustration of a method of manufacturing an article with the superstrate as described within the disclosure, according to one embodiment.

FIGS. 5A to 5C and the method 600 of FIG. 6 illustrate a process in which the superstrate 408 can be used to form an adaptive planarization layer over a substrate 102. The features in FIGS. 5A to 5C are exaggerated to simplify understanding. The method 600 of forming a planarization layer over a substrate can begin at step 610 by dispensing formable material 124 onto the substrate 102. In one embodiment, the formable material 124 dispensed may be in the form of droplets. In one embodiment, the substrate 102 can include a non-uniform surface topography. In another embodiment, the surface of the substrate 102 may be uniform. In yet another embodiment, the surface of the substrate 102 may have a repeating or periodic pattern. The formable material 124 can include a polymerizable material, such as a resist. The formable material 124 can be positioned on the substrate 102 in one or more layers using techniques such as droplet dispense, spin-coating, dip coating, chemical vapor deposition (CVD), physical vapor deposition (PVD), thin film deposition, thick film deposition, or combinations thereof. FIG. 5A include a cross-sectional view of a substrate 102, such as a semiconductor wafer, having a surface 503, and one or more droplets of formable material 124 overlying the surface 503 of the substrate 102. By understanding the boundary that is formed from the transition from flat surface to chamfered area, the superstrate 408 can aid in drop pattern mapping and minimize unwanted thickness variation or extrusion formation near the edge of the planarized area. Additionally, the opaque layer 422 can block visible and UV light from transferring through the superstrate allowing the edge of the superstrate to be detected by optical sensors. As such, the superstrate 408 can advantageously aid in substrate registration or positioning, substrate handling to prevent collision or placement error, and drop pattern mapping.

At contacting operation 620, a superstrate 408, such as the superstrate described above, can contact the formable material 124. In one embodiment, the first surface of the body of the superstrate contacts the formable material on the substrate. As the superstrate 408 contacts the formable material 124, any trapped gas particles can dissipate through the curing layer, the substrate, or the superstrate 408. In an embodiment, the superstrate 408 may be bowed during the contacting operation 620 to allow trapped gas to escape during the contacting operation 620. In one embodiment, the superstrate 408 can contact the formable material 124 to form a film on the substrate 102, as seen in FIG. 5B. At a curing operation 630, the formable material 124 can be cured to form a layer over the substrate 102. In one embodiment, curing is performed while superstrate 408 is contacting the formable material 124. In one embodiment, one or more light sources are positioned over the superstrate 408 after the formable material 124 is dispensed on the substrate 102 to cure the formable material 124. The formable material 124 can include a monomer or oligomer mixture that can be cured using ultraviolet light, violet light, blue light, heat, or the like. In one embodiment, the chamfered edge 210 can include an opaque layer 422 to direct the light rays, arrows in FIG. 5B, away from any formable material 124 beneath the edge. In another embodiment, the formable material 124 contacting the working surface 112 of the superstrate 408 can be cured while the formable material 124 contacting or directly below the chamfered edge 210 can remain in a liquid state.

The method can continue at a separation operation 640 and as seen in FIG. 5C, the superstrate 408 can be separated from the newly formed cured planarized layer 524 formed on the substrate 102. As the superstrate 408 separates, the formable material 124 that was on the superstrate 408, and specifically any formable material on the chamfered edge 210, evaporates away thereby preventing any extrusion defects that would have otherwise occurred. The substrate can be further processed to form an article. The methods can be useful in manufacturing an article that includes a substrate, such as an electronic component that includes part of a semiconductor wafer. In one embodiment a method of manufacturing an article can include depositing a formable material 124 on a substrate 102 and contacting a superstrate 408 with the formable material 124 on the substrate 102. In one embodiment, the superstrate 408 can include a body having a first surface, a second surface opposite the first surface, and a chamfered edge between the first surface and the second surface, where an opaque layer coats the chamfered edge. The method of manufacturing an article can further include curing the formable material 124 to form a planar layer, separating the superstrate 408 and the from the planar layer on the substrate 102, processing the substrate 102 on which the planar layer has been formed, and manufacturing the article from the processed substrate 102.

Figure 7A:
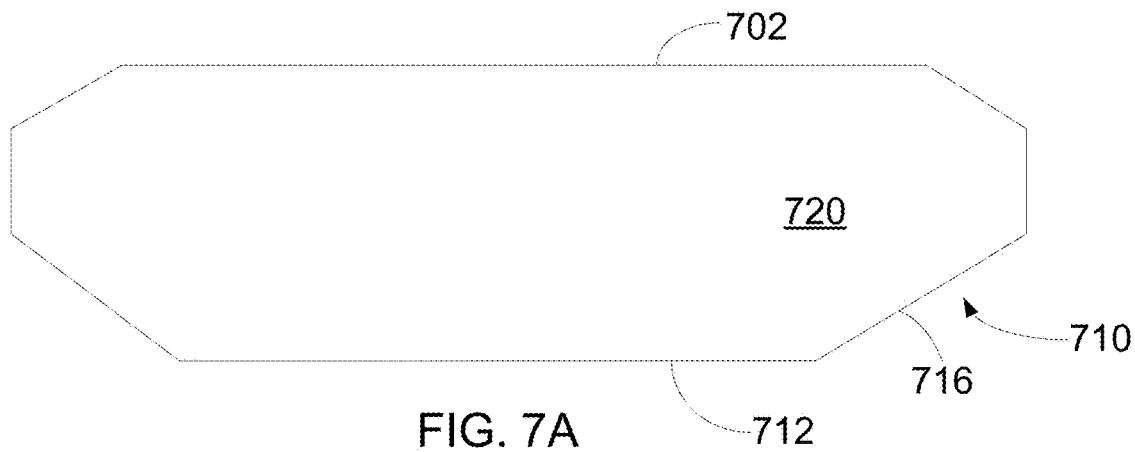
FIGS. 7A-7C include an illustration of a cross-sectional view of a superstrate during manufacturing, according to one embodiment.
Figure 7B:
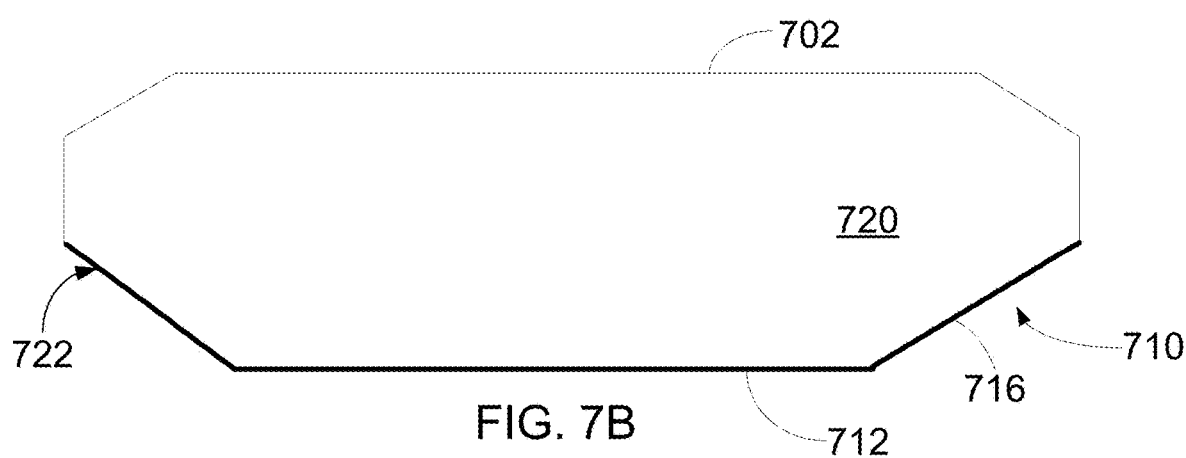
Figure 7C:
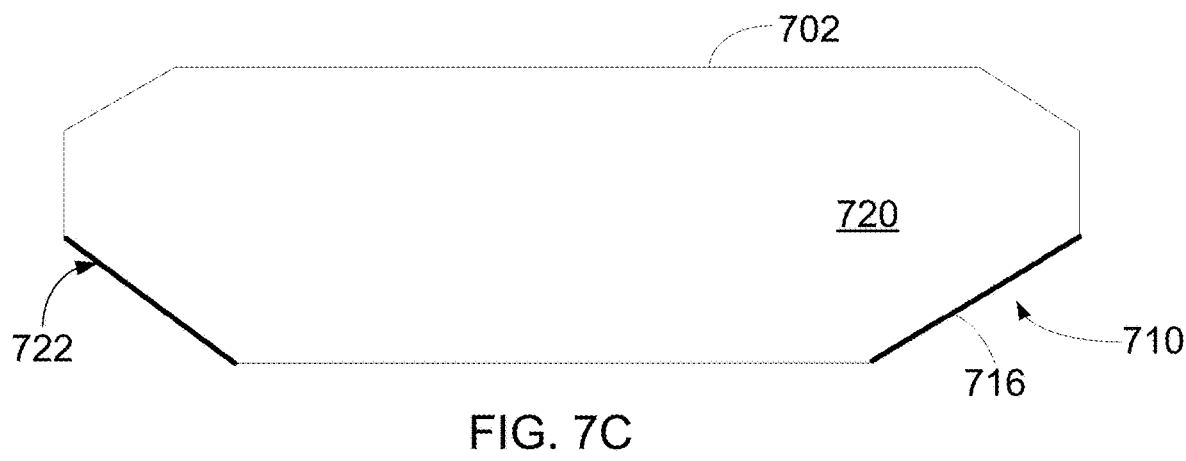

A manufacturing process of a superstrate, such as a superstrate described above, may include the following steps, as seen in FIGS. 7A-7C. The method can begin registering a location of the superstrate by detecting a reflection of visible light off of a coating. In one embodiment, the coating can be the coating described above. The method can continue by handling the superstrate based on a registered location of the superstrate to load the superstrate onto a superstrate chuck for holding the superstrate. In one embodiment, a robot can handle the superstrate from a front opening unified pod (foup) or from one or more superstrates located in the same location. In another embodiment, manual handling of the superstrate can occur. In other words, the layer coated on the angled surfaces, as further described below, of the superstrate can aid in identification of a particular superstrate when the superstrate is within a grouping of superstrates.

The method can continue at a receiving step by providing a superstrate 720, as seen in FIG. 7A. The superstrate may be a blank superstrate with a first surface 712, a second surface 702 substantially parallel to the first surface 712, and a chamfered edge 710 connecting the first surface 712 to the second surface 702. In one embodiment, the chamfered edge 710 can include one or more angled and/or curved surfaces. The method can continue to a first deposition step by depositing a coating such as an opaque layer 722 over the first surface 712 of the superstrate 720 and a first angled surface 716 of the chamfered edge 710, as seen in FIG. 7B. In one embodiment, the opaque layer 722 may include one or more of chrome, chromium, molybdenum, tantalum, silicon, tungsten, titanium, aluminum, iron oxide, titanium, or a silver-halide emulsion. The first deposition step may be done using known methods such as sputtering and evaporation. A subsequent etching step can remove the opaque layer 722 from the first surface 712 of the superstrate 720 while leaving the opaque layer 722 on the first angled surface 716 of the chamfered edge 710, as seen in FIG. 7C. In an alternative embodiment, a subsequent polishing step can remove the opaque layer 722 from the first surface 712 of the superstrate 720 while leaving the opaque layer 722 on the first angled surface 716 of the chamfered edge 710.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A superstrate for forming a planarization layer on a substrate, comprising:
a body having a first surface, a second surface opposite the first surface, and a chamfered edge between the first surface and the second surface, wherein a layer coats the chamfered edge.

2. The superstrate of claim 1, wherein the chamfered edge comprises a first surface and one or more angled surfaces, and wherein the layer coats a first angled surface.

3. The superstrate of claim 2, wherein the first angled surface is between the first surface of the body and the first surface of the chamfered edge.

4. The superstrate of claim 2, wherein the layer coats the first angled surface and a portion of the second surface of the body.

5. The superstrate of claim 2, wherein the layer coats the entire chamfered edge and a portion of the second surface of the body.

6. The superstrate of claim 5, wherein the portion of the second surface of the body has a length that is between 10% and 30% a total length of the second surface.

7. The superstrate of claim 1, wherein the layer comprises chrome, chromium, molybdenum, tantalum, silicon, tungsten, titanium, aluminum, iron oxide, or a silver-halide emulsion.

8. The superstrate of claim 1, wherein the body includes soda lime glass, quartz, borosilicate glass, alkali-barium silicate glass, aluminosilicate glass, or synthetic fused silica.

9. The superstrate of claim 1, wherein the layer has one or more of the following optical properties:
a reflectance of visible light that is greater than 30%; and an absorbance of UV light that is greater than 70%.

10. The superstrate of claim 1, wherein the layer has the following optical properties:
a reflectance of visible light that is greater than 30%; and an absorbance of UV light that is greater than 70%.

11. A method of manufacturing an article, the method comprising:
depositing a formable material on the substrate,
contacting the formable material on the substrate with a superstrate to form a planar layer, wherein the superstrate comprises:
a body having a first surface;
a second surface opposite the first surface; and
a chamfered edge between the first surface and the second surface, wherein a layer coats the chamfered edge;
curing the formable material on the substrate to form the planar layer;
separating the superstrate from the planar layer on the substrate;
processing the substrate on which the planar layer has been formed; and
manufacturing the article from the processed substrate.

12. The method of manufacturing the article of claim 11, further comprising:
registering a location of the superstrate by detecting a reflection of visible light off of the layer coating the chamfered edge; and
handling the superstrate based on the registered location of the superstrate to load the superstrate onto a superstrate chuck used for holding the superstrate.

13. The method of manufacturing the article of claim 11, wherein the first surface of the body of the superstrate contacts the formable material on the substrate.

14. The method of manufacturing the article of claim 11, wherein an area of the superstrate is larger than an area of the substrate.

15. A method of manufacturing a superstrate, comprising:
forming a body with a first surface, a second surface opposite the first surface, and a chamfered edge between the first surface and the second surface;
coating the first surface and the chamfered edge with an opaque material; and
removing the opaque material from the first surface.

16. The method of manufacturing the superstrate of claim 15, wherein the chamfered edge comprises a first surface and one or more angled surfaces, and wherein coating the chamfered edge with the opaque material comprises coating a first angled surface of the chamfered edge.

17. The method of manufacturing the superstrate of claim 16, wherein the first angled surface is a mirror of a second angled surface.

18. The method of manufacturing the superstrate of claim 17, wherein the first angled surface has a length that is less than the second angled surface.

19. The method of manufacturing the superstrate of claim 17, wherein the second angled surface is between the second surface of the body and the first angled surface of the chamfered edge.

20. The method of manufacturing the superstrate of claim 15, wherein removing the material from the first surface is done by polishing the first surface.

* * * * *